(12) United States Patent
Hasler et al.

(10) Patent No.: US 7,965,559 B2
(45) Date of Patent: Jun. 21, 2011

(54) SYSTEMS AND METHODS FOR IMPROVED FLOATING-GATE TRANSISTOR PROGRAMMING

(75) Inventors: Paul Hasler, Atlanta, GA (US);
Arindam Basu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 167 days.

(21) Appl. No.: 12/473,146

(22) Filed: May 27, 2009

(65) Prior Publication Data

US 2009/0323425 A1      Dec. 31, 2009

Related U.S. Application Data

(60) Provisional application No. 61/056,227, filed on May 27, 2008.

(51) Int. Cl.
*G11C 11/34* (2006.01)
*G11C 16/04* (2006.01)
*G11C 16/06* (2006.01)

(52) U.S. Cl. .......... 365/185.21; 365/185.19; 365/185.28

(58) Field of Classification Search ............. 365/185.19, 365/185.21, 185.28
See application file for complete search history.

(56) References Cited

U.S. PATENT DOCUMENTS

| | | | | |
|---|---|---|---|---|
| 3,840,809 | A | * | 10/1974 | Yun ............................... 324/658 |
| 5,272,669 | A | | 12/1993 | Samachisa et al. |
| 6,459,296 | B2 | | 10/2002 | Bradl et al. |
| 6,898,097 | B2 | | 5/2005 | Dugger et al. |
| 7,038,947 | B2 | * | 5/2006 | Chih ........................ 365/185.18 |
| 7,109,749 | B2 | | 9/2006 | Khanna et al. |
| 2004/0130943 | A1 | * | 7/2004 | Hirano et al. ............ 365/185.01 |
| 2006/0261846 | A1 | | 11/2006 | Twigg et al. |
| 2007/0046325 | A1 | | 3/2007 | Balasubramanian et al. |
| 2008/0048715 | A1 | | 2/2008 | Balasubramanian et al. |

OTHER PUBLICATIONS

Basu, Arindam et al., "A Fully Integrated Architecture for Fast Programming of Floating Gates", School of Electrical and Computer Engineering, Georgia Institute of Technology, GA.

* cited by examiner

*Primary Examiner* — Ly D Pham
(74) *Attorney, Agent, or Firm* — Ryan A. Schnieder, Esq.; Troutman Sanders, LLP

(57) ABSTRACT

The present invention describes systems and methods for improving the programming of floating-gate transistors. An exemplary embodiment of the present invention provides a floating-gate transistor programming system including an array of floating-gate transistors and a measuring circuit comprising a logarithmic transimpedance amplifier and an analog-to-digital converter. Furthermore, the floating-gate transistor programming system includes an injecting circuit comprising a digital-to-analog converter, wherein the pulsing circuit can inject charge into each of the floating-gate transistors and the measuring circuit can measure a present charge value in one of the plurality of floating-gate transistors.

14 Claims, 10 Drawing Sheets

SYSTEMS AND METHODS FOR IMPROVED FLOATING-GATE TRANSISTOR PROGRAMMING

CROSS REFERENCE TO RELATED APPLICATION

This application claims the benefit of U.S. Provisional Application No. 61/056,227, filed 27 May 2008, which is hereby incorporated by reference in its entirety as if fully set forth below.

FIELD OF THE INVENTION

The present invention relates generally to systems and methods for programming floating-gate transistors and, more particularly, to systems and methods for rapid and efficient programming of floating-gate transistors.

BACKGROUND

Analog signal processing presents a number of advantages in a variety of implementations, including significant power efficiencies, computational efficiencies, and limited die area requirements. Unfortunately, analog design is often more costly than equivalent digital design due to an often time-consuming design and verification process. Many attempts have been made to apply rapid-prototyping techniques known from the digital domain to analog designs. Specifically, Field Programmable Analog Arrays ("FPAA"s) have been developed, which attempt to emulate the convenience and programmability of their digital counterparts, Field Programmable Gate Arrays ("FPGAs"). An FPAA is an integrated circuit, which can be configured to implement various analog functions using a set of Configurable Analog Blocks ("CAB") and a programmable interconnection network. Each CAB can implement a number of analog signal processing functions such as amplification, integration, differentiation, addition, subtraction, multiplication, comparison, log, and exponential. Analog designers can use the FPAA for prototype and design verification or even for designs that are adaptable in the field to varying requirements or environmental conditions.

Therefore, it would be advantageous to provide an apparatus and method for efficiently and effectively programming arrays of floating-gate transistors.

Additionally, it would be advantageous to provide an apparatus and method to provide low power consumption device for rapidly programming arrays of floating-gate transistors.

Additionally, it would be advantageous to provide an improved system and method for providing a system for programming floating-gate transistors with a wide dynamic range.

BRIEF SUMMARY

The present invention describes systems and methods for improving the programming of floating-gate transistors. An exemplary embodiment of the present invention provides a floating-gate transistor programming system including an array of floating-gate transistors and a measuring circuit comprising a logarithmic transimpedance amplifier and an analog-to-digital converter. Furthermore, the floating-gate transistor programming system includes an injecting circuit comprising a digital-to-analog converter, wherein the pulsing circuit can inject charge into each of the floating-gate transistors and the measuring circuit can measure a present charge value in one of the plurality of floating-gate transistors.

In addition to floating-gate transistor programming systems, the present invention provides a method of programming the floating-gate transistor involving selecting a floating-gate transistor and measuring a present charge value on a gate of the floating-gate transistor. Furthermore, the method for programming a floating-gate transistor involves determining an injection pulse period and a drain voltage and setting a drain voltage for the floating-gate transistor. Finally, the method for programming a floating-gate transistor involves pulsing a drain of the floating-gate for the injection pulse period.

These and other objects, features and advantages of the present invention will become more apparent upon reading the following specification in conjunction with the accompanying drawing figures.

DETAILED DESCRIPTION

Figure 1:
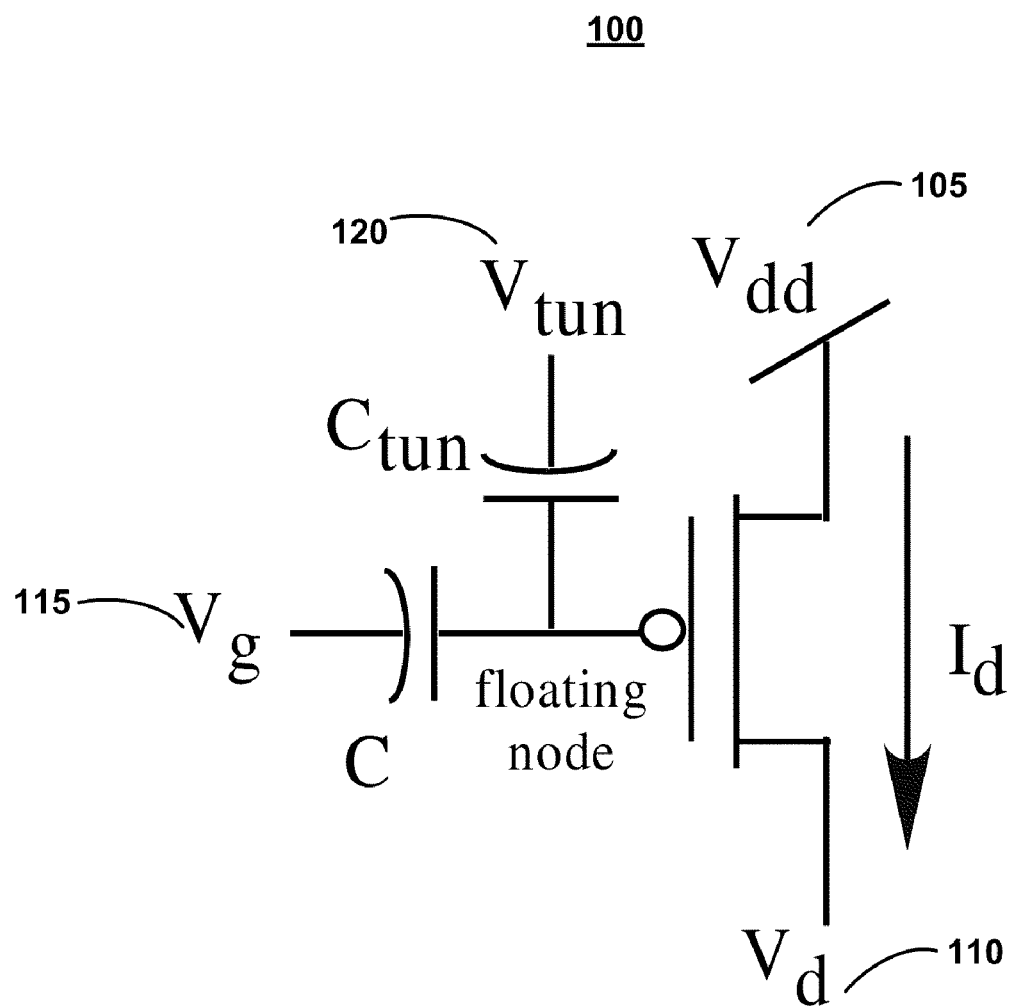
FIG. 1 provides an illustration of a floating-gate transistor 100 configured in accordance with an exemplary embodiment of the present invention.

The present invention addresses the deficiencies in the prior art concerning the inability to efficiently and rapidly program an array of floating-gate transistors. Significantly, the present invention provides methods and apparatus for providing for fast and efficient programming of floating-gate transistors using a logarithmic transimpedance amplifier. A floating-gate transistor programming system provided in accordance with the present invention is enabled to rapidly program floating-gate transistors over a wide dynamic range with relatively low power consumption. Additionally, the present invention overcomes the drawbacks of the conventional methods and systems in the prior art and provides systems and methods enabled to provide rapidly programmable analog designs.

An exemplary embodiment of the present invention provides a floating-gate transistor programming system including an array of floating-gate transistors and a measuring circuit comprising a logarithmic transimpedance amplifier and an analog-to-digital converter. Furthermore, the floating-gate transistor programming system includes an injecting circuit comprising a digital-to-analog converter, wherein the pulsing circuit can inject charge into each of the floating-gate transistors and the measuring circuit can measure a present charge value in one of the plurality of floating-gate transistors.

In addition to floating-gate transistor programming systems, the present invention provides a method of programming the floating-gate transistor involving selecting a floating-gate transistor and measuring a present charge value on a gate of the floating-gate transistor. Furthermore, the method for programming a floating-gate transistor involves determining an injection pulse period and a drain voltage and setting a drain voltage for the floating-gate transistor. Finally, the method for programming a floating-gate transistor involves pulsing a drain of the floating-gate for the injection pulse period.

The floating-gate transistor programming systems enabled by the present invention present significant advantages to analog design, such as rapidly programmable FPAAs. An exemplary embodiment of the floating-gate transistor programming system can provide an on-chip solution with significant advancements in both programming speed and efficiency over the prior art. Traditionally, the bottleneck for floating-gate transistor programming systems has been in the time required to measure the charge stored in a particular floating-gated required for each iteration of a programming sequence, which is usually performed by a current measurement. Conventional programming devices have accomplished current measuring by measuring the channel current in a transistor using an ammeter, such as a pico-ammeter. These conventional devices creates a significant bottleneck as the current measurement time by the ammeter dominates the programming cycle. Furthermore, these conventional devices are increasingly inefficient when attempting to provide a broad dynamic programming range for an array of floating-gate transistors. For example, in order to provide a robust and flexible FPAA suitable in many design implementations, the FPAA must be enabled to program the transistors over multiple decades of current. Unfortunately, with conventional devices the dynamic range of the FPAA is inversely proportional to the programming time of the FPAA.

Significantly, an exemplary embodiment of the floating-gate transistor programming system provided in accordance with present invention removes the bottleneck present in conventional devices by implementing a logarithmic transimpedance amplifier in the measuring circuit of the system. The logarithmic transimpedance amplifier can be configured to rapidly convert current over a wide dynamic range with relatively limited power consumption. More particularly, the logarithmic transimpedance amplifier of an exemplary embodiment of the floating-gate transistor programming system can increase the bandwidth by implementing an amplifier in the feedback loop and relying upon logarithmic compression of the current to obtain a wide dynamic current measurement range. For example, and not limitation, and a logarithmic transimpedance amplifier in an exemplary embodiment of the floating-gate transistor programming system can be configured to convert currents from picoamperes to microamperes with resolution of greater than eight bits. Furthermore, an exemplary embodiment of the floating-gate transistor programming system can be implemented in relatively minimal chip area.

FIG. 1 provides an illustration of a floating-gate transistor 100 configured in accordance with an exemplary embodiment of the present invention. The exemplary embodiment of the floating-gate transistor 100 shown in FIG. 1 provides a P-type Metal Oxide Semiconductor Field Effect Transistor ("P-type MOSFET") embodiment of a Floating-Gate Metal Oxide Semiconductor ("FGMOS"). Those of skill in the art will appreciate that the floating-gate transistor 100 could also be an N-type Metal Oxide Semiconductor Field Effect Transistor ("N-type MOSFET"). In an exemplary embodiment, the floating-gate transistor 100 can be programmed by storing a quantity of charge on the floating-gate of the transistor. In an exemplary embodiment, the floating-gate transistor 100 can be programmed by a hot-electron injection process. In a non-limiting example, programming can be achieved by modulating both the width of an injection pulse and the drain-source potential of the P-type MOSFET. Those of skill in the art will appreciate that a number of suitable programming techniques are available in addition to hot-electron injection.

In an exemplary embodiment, the method of programming the floating-gate transistor includes a measuring mode and an injecting mode. In an exemplary embodiment of the method of programming the floating-gate transistor, the measuring step involves determining the amount of charge in a floating-gate transistor 100 and the injecting step involves inserting an incremental additional charge into the floating-gate transistor 100. In an exemplary embodiment, the method of programming the floating-gate transistor is an iterative process that involves measuring the level of charge in the floating-gate transistor 100 and if the charge has not reached the desired programming level, an additional iteration of the injecting step can be performed. In an exemplary embodiment, the floating-gate transistor 100 can be injected by a ramp-up and pulse procedure. The ramp-up can involve raising all the terminal voltages, $V_{dd}$ 105, $V_d$ 110, $V_g$ 115, and $V_{tun}$ 120, to a value higher than the normal operation value while holding their relative values the same. Once the terminal voltages have been ramped-up, in an exemplary embodiment of the method of programming the floating-gate transistor, injection can be carried out by pulsing the drain of the floating-gate transistor 100 to a lower voltage for an injection pulse period ("$t_{pulse}$").

Figure 2:
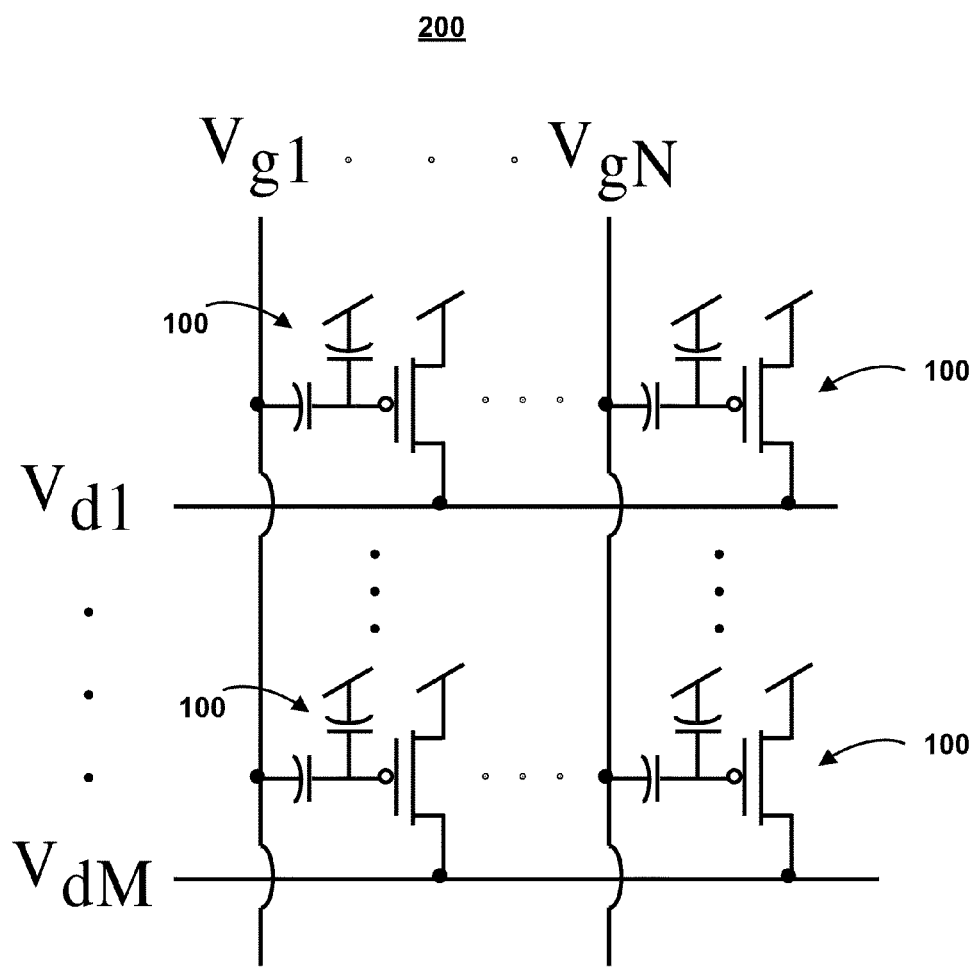
FIG. 2 provides an illustration of an array 200 of floating-gate transistors 100 configured in accordance with an exemplary embodiment of the present invention.

FIG. 2 provides an illustration of an array 200 of floating-gate transistors 100 configured in accordance with an exemplary embodiment of the present invention. The array 200 shown in FIG. 2 illustrates how multiple floating-gate transistors 100 can be configured in an exemplary embodiment. The array can enable a dense layout of multiple floating-gate transistors 100 and an efficient means for addressing these transistors 100. In an exemplary embodiment, each floating-gate transistor 100 in the array 200 can be selected by applying an enabling voltage to the gate and drain terminals of the transistor 100. In the exemplary embodiment shown in FIG. 2, the array 200 provides a coordinate system of gate traces, $V_{g1}$ to $V_{gN}$, and drain traces, $V_{d1}$ to $V_{dM}$. Thus, in this exemplary embodiment, a particular floating-gate transistor 100 can be selecting by applying an enabling voltage to the appropriate gate trace, $V_{gX}$, and drain trace, $V_{dX}$. All other floating-gate transistors 100 in the array 200 can have either of the gate or drain voltages set to $V_{dd}$ to prohibit injection in an exemplary embodiment, as ample source current and large drain-channel potential are typically necessary for hot electrons to inject into the gate.

Figure 3:
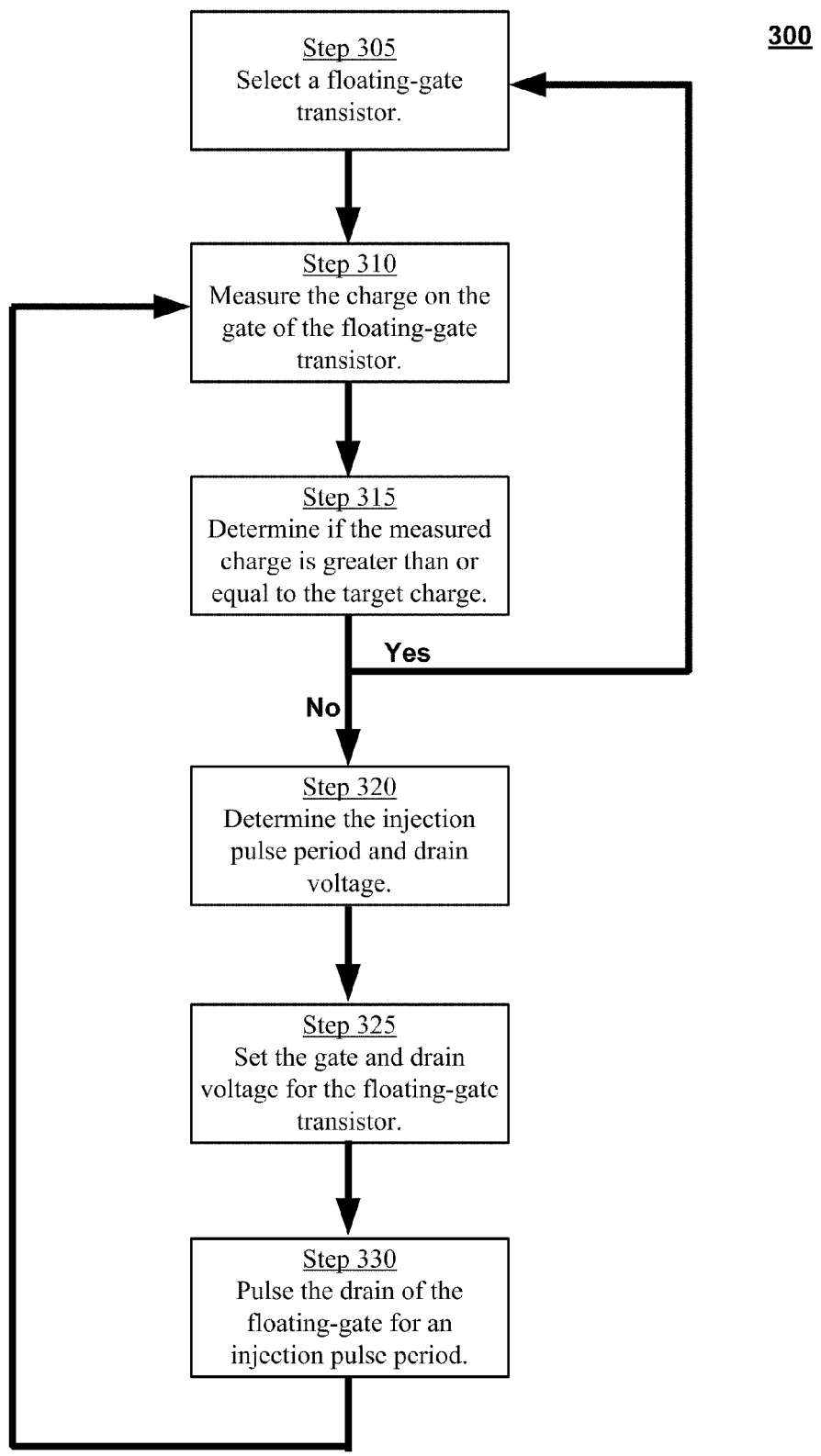
FIG. 3 provides a flow chart of a method of programming the floating-gate transistor 300 in accordance with an exemplary embodiment of the present invention.

FIG. 3 provides a flow chart of a method of programming the floating-gate transistor 300 in accordance with an exemplary embodiment of the present invention. As shown in FIG. 3, the first step 305 can involve selecting at least one floating-gate transistor. Once one or floating-gate transistors have been selected, the second step 310 of an exemplary embodiment of the method of programming the floating-gate transistor 300 can involve measuring the present charge value on the gate of the floating-gate transistor. The measuring step 310 can involve determining a measured current ("$I_{meas}$") of the floating-gate transistor. Next, the third step 315 in an exemplary embodiment of the method of programming the floating-gate transistor 300 can involve determining whether the present charge value is greater than or equal to a target charge for the floating-gate transistor. In an exemplary embodiment, the target charge can be the desired programming level of a particular floating-gate transistor. The determining step 315, in an exemplary embodiment, can involve comparing the present charge value, a measured current value ("$I_{meas}$"), to the targeted charge value, represented as a target current value ($I_{target}$).

In the event that $I_{meas} \geq I_{target}$, then desired programming level for that particular floating-gate device has been reached. Therefore, in an exemplary embodiment of the method of programming the floating-gate transistor 300, a new floating-gate transistor can be selected. In the event that $I_{meas} < I_{target}$, then more programming of floating-gate transistor is needed. The fourth step 320 of an exemplary embodiment of the method of programming the floating-gate transistor 300 involves determining an injection pulse period and a drain voltage for the floating-gate transistor. The fifth step 325 of an exemplary embodiment of the method of programming the floating-gate transistor 300 involves setting the gate and drain voltage for the floating-gate transistor. The sixth step 330 of an exemplary embodiment of the method of programming the floating-gate transistor 300 involves pulsing the drain of the floating-gate transistor for an injection pulse period.

An exemplary embodiment of the method of programming the floating-gate transistor 300 shown in FIG. 3 provides an iterative approach to floating-gate transistor programming involving measuring and injecting until a desired state of charge is reached. Those of skill in the art will appreciate that steps 310-330 of the exemplary embodiment of the method of programming the floating-gate transistor 300 may need to be repeated numerous times before a desired state of charge in the floating-gate transistor is reached. Once a desired state of charge has been reached, the iterative programming process for one floating-gate transistor can stop and then begin for another floating-gate transistor.

Figure 4:
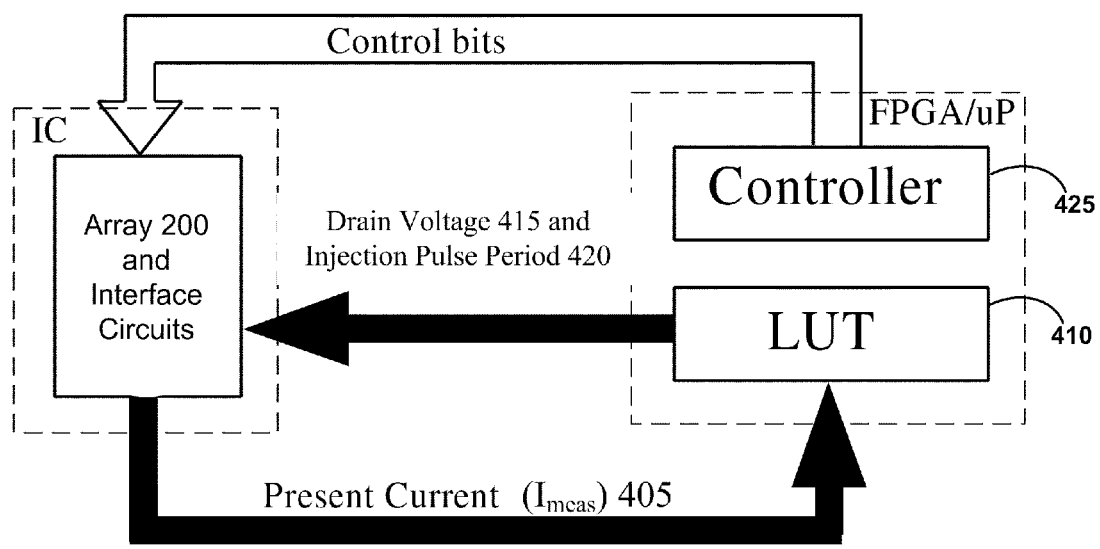
FIG. 4 provides block diagram of the data flow of a method of programming the floating-gate transistor 300 in accordance with an exemplary embodiment of the present invention.

FIG. 4 provides block diagram of the data flow of a method of programming the floating-gate transistor 300 in accordance with an exemplary embodiment of the present invention. The illustration in FIG. 4 pertains specifically to the step 320 of determining the injection pulse period and drain voltage for a particular injection iteration. As shown in FIG. 4, in an exemplary embodiment of the method of programming the floating-gate transistor 300, the determining step 320 provides the present value charge, measured as a current value ($I_{meas}$) 405, of a floating-gate transistor 100 as an input to a Look-Up Table ("LUT") 410. In an exemplary embodiment, the LUT 410 consists of values of the next drain voltage and the injection pulse period, which are provided in accordance with a programming algorithm.

In an exemplary embodiment of the method for programming a floating-gate transistor 300, the LUT 410 is a two dimensional table. For each input present current 405, an exemplary embodiment of the LUT 410 can provide as an output, a next drain voltage 415 and an injection pulse period 420. In an exemplary embodiment of the LUT 410, the x-axis of the table provides the drain voltage 415 and the y-axis provides the injection pulse period 420 for each entry in the table corresponding to a present current 405 value. In one embodiment, the present current 405 is input as a digital word to the LUT 410. The values of the LUT 410 dictate the appropriate programming values of various embodiments of the method for programming a floating-gate transistor 300. Therefore, the next drain voltage 415 and injection pulse period 420 values provided by the LUT 410 can be calculated in accordance with a particular algorithm constructed to match the parameters desired for a specific device such as a desired FPAA design. Those of skill in the art will appreciate that different algorithms for creating the values of the LUT 410 can be employed in accordance with different array 200 designs and implementations. In an exemplary embodiment, the process of input values into the LUT 410 and achieving the two output values can be carried out by a controller 425. Those of skill in the art will appreciate that the controller 425 can be a variety of suitable digital devices, including an FPGA, a Personal Computer ("PC"), and/or a microprocessor.

As shown in the exemplary embodiment in FIG. 4, the next drain voltage 415 and injection pulse period 420 values provided by the LUT 410 can be feed back to the floating-gate transistor array 200 and interface circuits for the next setting step 325 and pulsing step 330 of the method for programming a floating-gate transistor 300. FIG. 4 additionally illustrates a controller 430 that can be included in the FPGA or microprocessor and can be configured to execute addressing, measuring, and pulsing and other functions or steps of the method for programming a floating-gate transistor 300 in a floating-gate transistor array 200.

Figure 5:
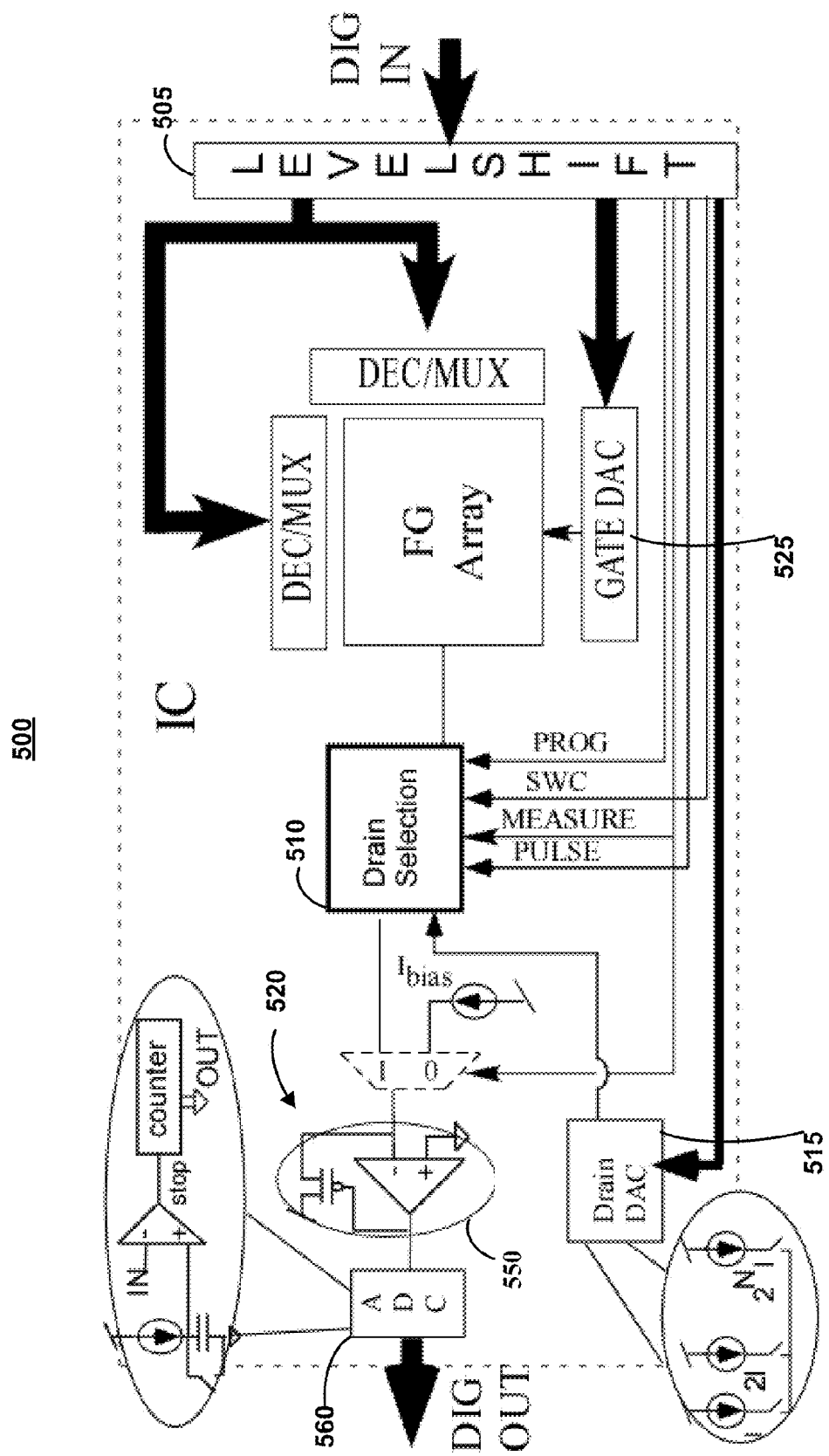
FIG. 5 provides an illustration of a floating-gate transistor programming system 500 configured in accordance with an exemplary embodiment of the present invention.

FIG. 5 provides an illustration of a floating-gate transistor programming system 500 configured in accordance with an exemplary embodiment of the present invention. As shown in FIG. 5, an exemplary embodiment of the floating-gate transistor programming system 500 can provide a floating-gate transistor array 200 and corresponding control and addressing devices to enable fast and efficient programming of the array 200. As shown in the exemplary embodiment in FIG. 5, the floating-gate transistor programming system 500 provides various decoding and multiplexing logic to select desired floating-gates from an array as well as data converters for interfacing with digital control logic, such as an FPGA or microprocessor. The floating-gate transistor programming system 500 in an exemplary embodiment is enabled to receive a digital input, such as a digital word, providing the address of a particular floating-gate transistor 100 to be programmed. In an exemplary embodiment, programming can be carried out by ramping-up the terminal voltages of the floating-gate transistor array 200. In this exemplary embodiment, level shift devices 505 can be provided by the floating-gate transistor programming system 500 to convert the digital input signals to the level of the programming $V_{dd}$. For example, and not limitation, the level shift devices 505 can convert a 3.3V digital input to the level of programming $V_{dd}$.

In an exemplary embodiment, the floating-gate transistor programming system 500 includes a selection device 510 configured to provide the desired gate and drain voltages to the selected floating-gate transistor 100 within the floating-gate transistor array 200. In one embodiment, the source of all the floating-gate transistors 100 in the floating-gate transistor array 200 are set to $V_{dd}$ and are not tied to the selection device 510. Furthermore, in one embodiment the gate and drain terminals of all unselected floating-gate transistors 100 of the floating-gate transistor array 200 are set to $V_{dd}$, while the selection circuit 510 provides the desired gate and drain voltages to the selected floating-gate transistor 100.

In exemplary embodiment, the selection circuit 510 enables the drain of a selected floating-gate transistor 100 to connect to the drain of the selected floating-gate transistor 100 to a Drain Digital-to-Analog Converter ("DAC") 515, $V_{dd}$, or ground in injection mode and to a measuring circuit 520 in measuring mode. The measuring circuit 520 in an exemplary embodiment is comprised of one or more devices that can quantify the amount of charge on the floating-gate of a particular floating-gate transistor 100. Additionally, the exemplary embodiment of the floating-gate transistor programming system 500 shown in FIG. 5 provides a Gate DAC 525 that interfaces with the floating-gate transistor array 200. During injection mode, both the Drain DAC 515 and the Gate DAC 525 can provide the necessary voltage to the gate and drain of the floating-gate transistor 100 in the floating-gate transistor array 200 that is to be programmed. In an exemplary embodiment, the Drain DAC 515 and the Gate DAC 525 can be configured to interface with a controller, such as an FPGA or microprocessor, through a System Packet Interface ("SPI"). In one embodiment, the Drain DAC 515 is used only during the injection mode and the Gate DAC 525 is used in both the injection mode and the operation mode of the floating-gate transistor programming system 500.

In an exemplary embodiment, the measuring circuit 520 of the floating-gate transistor programming system 500 includes a logarithmic transimpedance amplifier ("TIA") 550. The logarithmic transimpedance amplifier 550 can be configured in an exemplary embodiment to generate an output voltage proportional to the log of an input current. Those of skill in the art will appreciate that a TIA is generally a current-to-voltage converter that is configured to perform current to voltage transformation. The logarithmic transimpedance amplifier 550 provided in an exemplary embodiment of the floating-gate transistor programming system 500 provides many advantages to the measuring circuit 520. Significantly, the logarithmic compression of the logarithmic transimpedance amplifier 550 can efficiently measure currents over several decades of magnitude. In an exemplary embodiment, the logarithmic transimpedance amplifier 550 can be configured with an adaptive biasing scheme to maintain stability without dissipating excessive power. In an exemplary embodiment, the logarithmic transimpedance amplifier 550 shown in FIG. 5 can provide an output to a low pass filter, which can then be digitized by a ramp Analog-to-Digital Converter ("ADC") 560. The combination of the logarithmic transimpedance amplifier 550 with the floating point ADC 560 shown in the exemplary embodiment of the measuring circuit 520 in FIG. 5 results in a floating point ADC enabled to measured the programmed current of a floating-gate transistor 100.

By efficiently measuring a wide range of currents, the measuring circuit 520 of an exemplary embodiment of the floating-gate transistor programming system 500 can rapidly measure the current programmed state of one or more of the floating-gate transistors 100 in the floating-gate transistor array 200. Thus, as shown in FIG. 5, an exemplary embodiment of the floating-gate transistor programming system 500 can provide an efficient and rapid system of programming floating-gate transistors 100.

Figure 6:
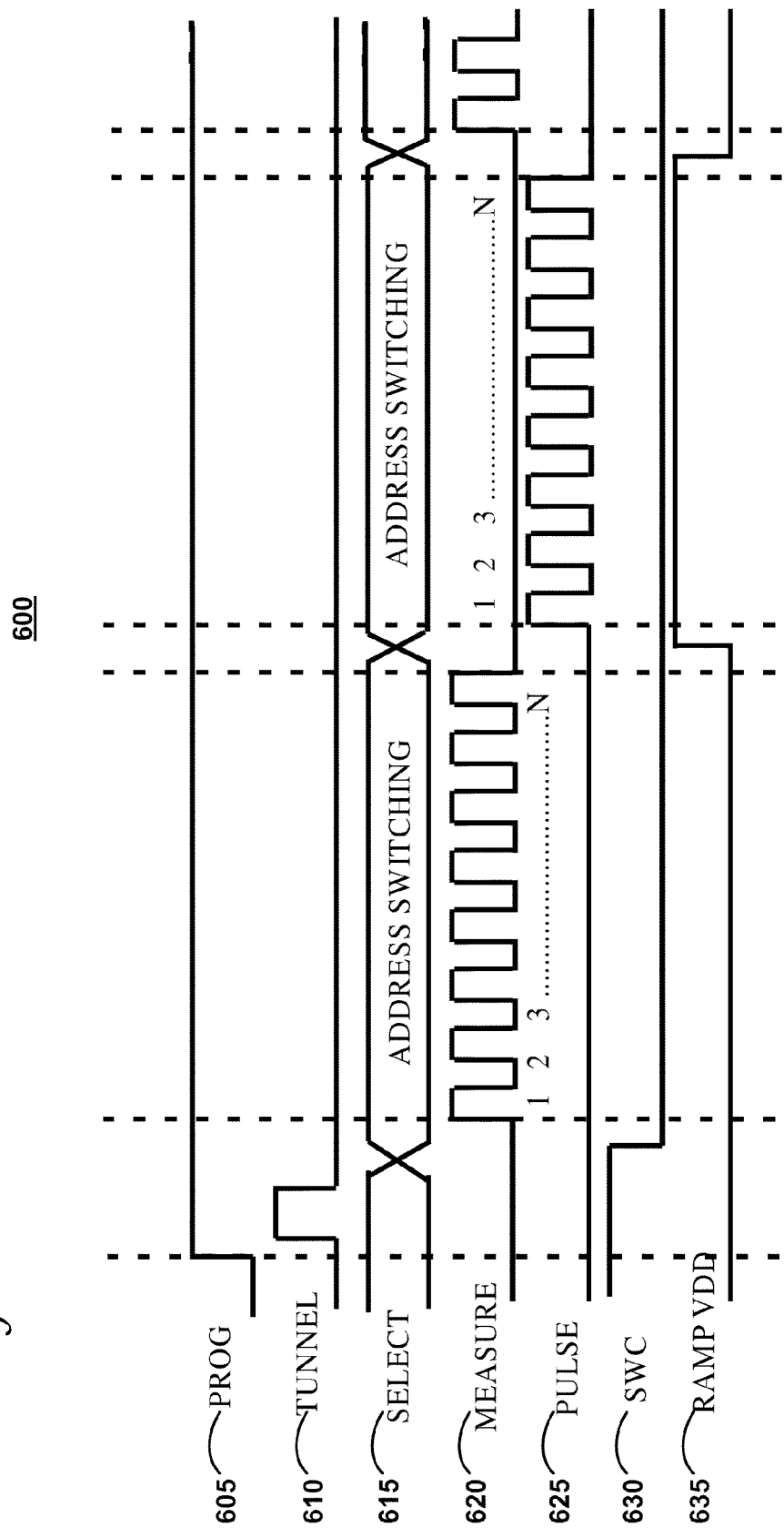
FIG. 6 provides a timing diagram 600 of the operation of the floating-gate transistor programming system 500 in accordance with an exemplary embodiment of the present invention.

FIG. 6 provides a timing diagram 600 of the operation of the floating-gate transistor programming system 500 in accordance with an exemplary embodiment of the present invention. The timing diagram 600 shown in FIG. 6 illustrates the timing relationship of various control signals, 605-635, used by floating-gate transistor programming system 500 to implement various embodiments of the method for programming a floating-gate transistor 300. The program signal ("PROG") 605 is set high when the floating-gate transistor array 200 is in program mode. In an exemplary embodiment, the floating-gate transistor programming system 500 can function in two main modes, a programming mode and an operation mode. For an exemplary embodiment, the floating-gate transistors 100 can be programmed in programming mode, and in operation mode, or run mode, the floating-gate transistors 100 can function as part of a larger device. In an exemplary embodiment, when the PROG signal 605 is low, the floating-gate transistor programming system 500 is in operation mode.

In an exemplary embodiment, the floating-gate transistors 100 of the floating-gate transistor programming system 500 can be erased with Fowler-Nordheim tunneling techniques. In one embodiment, a tunneling voltage connection is provided to each of the floating-gate transistors 100 in the floating-gate transistor array 200. Those of skill in the art will appreciate that a variety of erasing techniques can be employed in various embodiments of the floating-gate transistor programming system 500. In the exemplary embodiment shown in FIG. 6, when the tunnel signal ("TUNNEL") 610 is high, a global erase of the floating-gate transistor array 200 can be performed. In an exemplary embodiment, the SELECT signal 615 can provide the addressing information for a particular floating-gate transistor 100 or row of floating-gate transistors 100 that are to be measured or injected.

The measure ("MEASURE") signal 620, shown in FIG. 6, can provide a sub-mode for programming mode in an exemplary embodiment. When the MEASURE signal 620 is high, in the exemplary embodiment shown in FIG. 6, the floating-gate transistor programming system 500 is in measure mode. In measure mode, the charge value of the programmed floating-gate transistors 100 can be measured. In one embodiment, the charge value is calculated in the measure mode by measuring the current of a programmed floating-gate transistor 100 using the measuring circuit 520 of the floating-gate transistor programming system 500. In an exemplary embodiment, when the MEASURE signal 620 is low, the floating-gate transistor programming system 500 is another sub-mode of programming mode, the inject mode. In inject mode, in an exemplary embodiment, the floating-gate transistors 100 can be injected to increase the charge stored in the transistors 100.

FIG. 6 illustrates the timing relationship of the pulse signal ("PULSE") 625 in relation to the MEASURE signal 620. When the PULSE signal 625 is high in an exemplary embodiment, the floating-gate transistors 100 can be injected. In an exemplary embodiment, the width of the PULSE signal 625 shown in FIG. 6 determines the injection pulse period ($t_{pulse}$) for which the floating-gate transistor 100 is injected. Additionally, the SWC signal 630 in an exemplary embodiment can be asserted high when the chosen floating-gate needs to be programmed as an ON switch. Therefore, the SWC signal 630 can be high in an exemplary embodiment when the floating-gate transistor 100 needs to be programmed to an arbitrary low floating-gate voltage.

The timing diagram 600 in FIG. 6 provides an illustration of the execution of an iterative measure and inject programming sequence for one of the floating-gate transistors 100 in accordance with an exemplary embodiment of the method for programming a floating-gate transistor 300. As show in exemplary embodiment in FIG. 6, once the PROG signal 605 is asserted high, the floating-gate transistor programming system 500 enters programming mode and the TUNNEL signal 610 can be asserted high such that a tunneling pulse is executed by the floating-gate transistor programming system 500 to erase the floating-gate transistor array 200. Once the tunneling pulse has been sent, in an exemplary embodiment, the desired floating-gate transistor 100 or row of floating-gate transistors 100 can be selected in accordance with the SELECT signal 615. Once selected, in an exemplary embodiment, the measure mode can implemented and the MEASURE signal 620 can toggle for every element as it marks the beginning of the measuring circuit 620 conversion cycle. Once measuring is complete and the floating-gate transistor programming system 500 can switch from measuring mode to inject mode, in which the floating-gate transistor programming system 500 is ramped-up by "N" short pulses on the PULSE signal 625. In one embodiment, pulse width modulation is used in the injection mode to program the elements, and the duration of each of pulses corresponds to the injection pulse period provided by the LUT 410. In an alternative embodiment, drain voltage modulation is used in the injection mode, in which the Drain DAC 515 sets the drains of one or more floating-gate transistors 100 to the desired voltages before every pulse and the width of the each pulse of the PULSE signal 625 is fixed.

In an exemplary embodiment, the injection mode is completed by ramping down the floating-gate transistor array 200. Once injection mode is complete, the floating-gate transistor programming system 500 in an exemplary embodiment can return to measure mode and the modes can iterate until programming is done.

Figure 7:
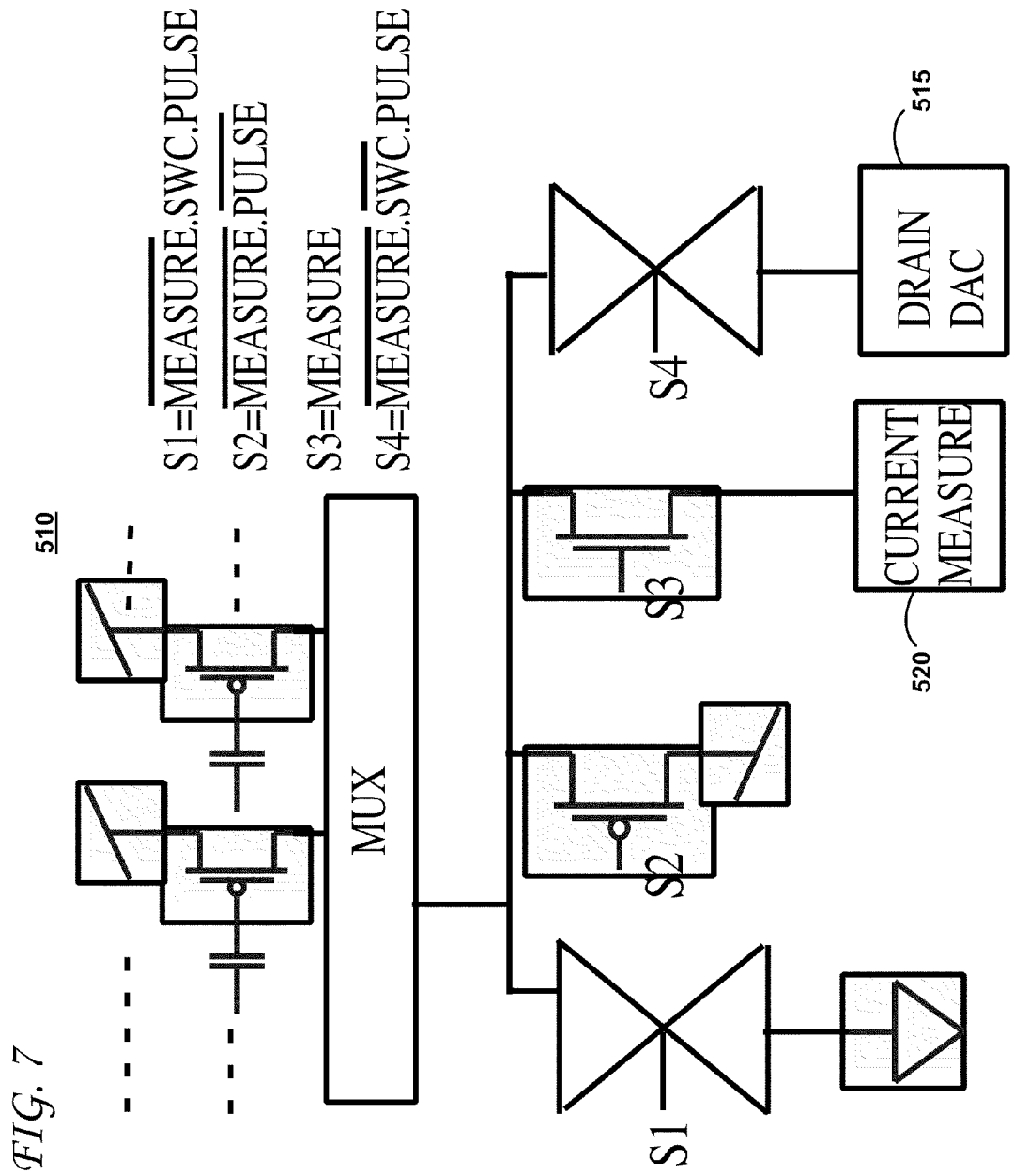
FIG. 7 provides an illustration of the selection circuit 510 of the floating-gate transistor programming system 500 in accordance with an exemplary embodiment of the present invention.

FIG. 7 provides an illustration of the selection circuit 510 of the floating-gate transistor programming system 500 in accordance with an exemplary embodiment of the present invention. In an exemplary embodiment, the selection circuit 510 can act as second selection level after the desired floating-gate transistor 100 has been selected by a multiplexer. The selection circuit 510 can switch the selected floating-gate transistor 100 between the injection mode, by connecting the floating-gate transistor 100 to either the Drain DAC 515, $V_{dd}$, or ground, and measuring mode by connecting the floating-gate transistors 100 to the measuring circuit 520. As shown in exemplary embodiment depicted in FIG. 7, there are four states or selections that the selection circuit 510 can provide. The first selection state, "S1," of the selection circuit 510 in an exemplary embodiment corresponds to a low MEASURE signal 620, a high SWC signal 630, and a high PULSE signal 625, connecting the desired floating-gate transistor 100 to ground. The second selection state, "S2," of the selection circuit 510 in an exemplary embodiment corresponds to a low MEASURE signal 620 and a low PULSE signal 625, connecting the desired floating-gate transistor 100 to $V_{dd}$. In the injection mode of an exemplary embodiment of the floating-gate transistor programming system 500, if the PULSE signal 625 is low, the drain of the selected floating-gate transistor 100 is tied to $V_{dd}$ to prohibit injection. The third selection state, "S3," of the selection circuit 510 in an exemplary embodiment corresponds to a high MEASURE signal 620, connecting the desired floating-gate transistor 100 to the measuring circuit 520. In an exemplary embodiment, the measuring circuit 520 includes a logarithmic transimpedance amplifier 550. The fourth selection state, "S4," of the selection circuit 510 in an exemplary embodiment corresponds to a low MEASURE signal 620, a low SWC signal 630, and a high PULSE signal 625, connecting the desired floating-gate transistor 100 to the Drain DAC 515.

Figure 8:
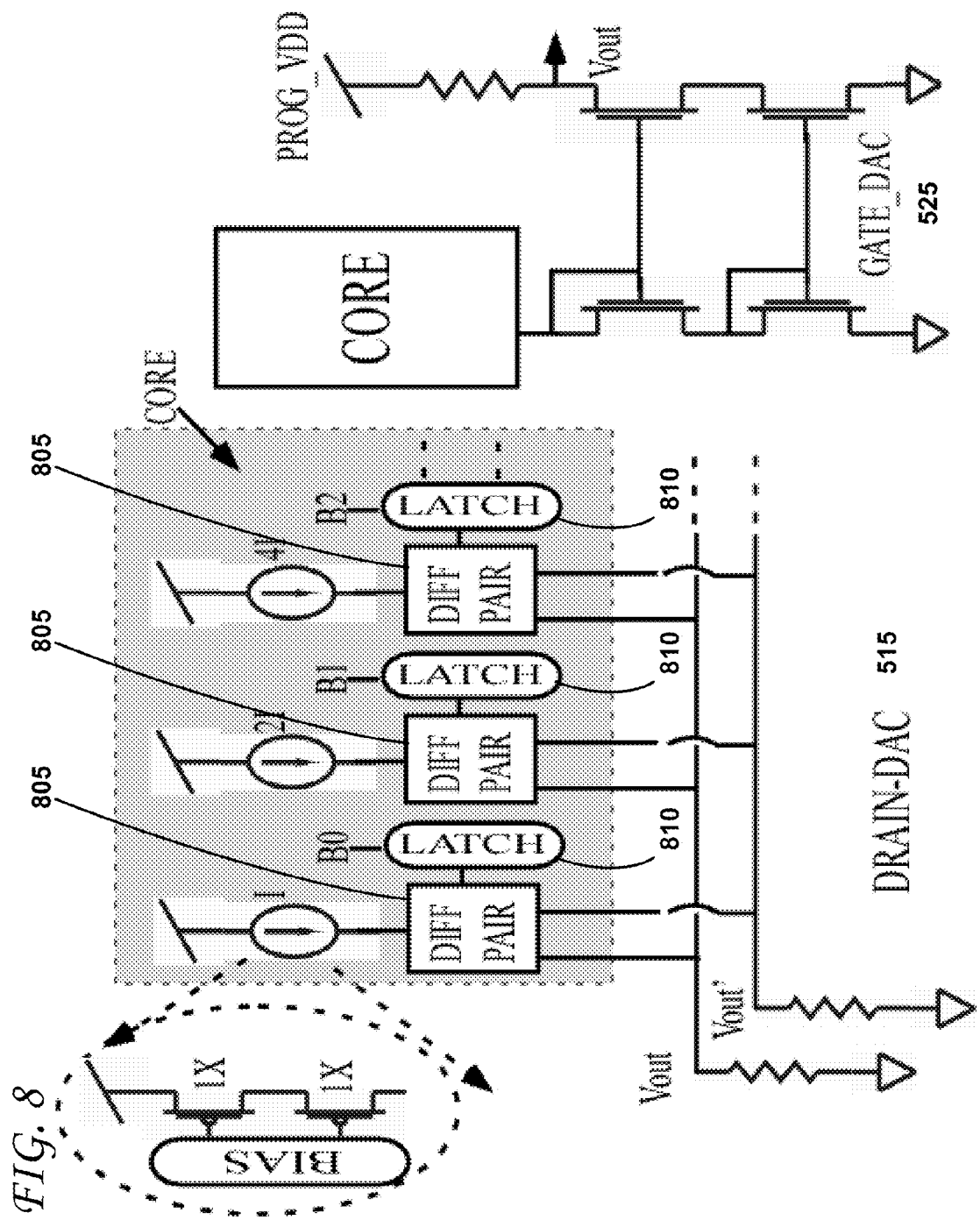
FIG. 8 provides a schematic of the Drain DAC 515 and the Gate DAC 525 of the floating-gate transistor programming system 500 in accordance with an exemplary embodiment of the present invention.

FIG. 8 provides a schematic of the Drain DAC 515 and the Gate DAC 525 of the floating-gate transistor programming system 500 in accordance with an exemplary embodiment of the present invention. The Drain DAC 515 shown in the exemplary embodiment in FIG. 8 provides a binary current scaled architecture in which the current sources are cascaded PFETs connected to a biasing structure. In one embodiment, the Drain DAC 515 is configured to satisfy 8 bit matching. The differential pairs 805 provided in an exemplary embodiment of the Drain DAC 515 enable an increase in the switching speed.

In an exemplary embodiment of the floating-gate transistor programming system 500 during injection mode, the Drain DAC 515 can provide the necessary voltage to the gate and drain of the floating-gate transistor 100 in the floating-gate transistor array 200 that is to be programmed. In an exemplary embodiment, the Drain DAC 515 can be configured to interface with a controller, such as an FPGA or microprocessor. The latches 810 of an exemplary embodiment of the Drain DAC 515 can be used to convert a digital signal, such as 3.3V signal, to smaller voltage swings with a low crossing point so that the ON transistor of the differential pair 805 is in saturation. In some embodiments, the Drain DAC 515 needs to provide voltages close to ground; thus, the currents can be directly passed into a resistor.

The Gate DAC 525 shown in the exemplary embodiment in FIG. 8 can be configured with a cascaded NFET current mirror connect to resistor referenced to the programmed $V_{dd}$. Furthermore, the Gate DAC 525 shown in the exemplary embodiment in FIG. 8 can be configured to provide voltages close to the programming $V_{dd}$. In an exemplary embodiment of the method for programming a floating-gate transistor 300, the Gate DAC 525 can be implemented to assist in improving the efficiency of a method for programming a floating-gate transistor 300. For example, and not limitation, the gate voltage of a floating-gate transistor 100 can be adjusted with the Gate DAC 525 when the present charge value of the transistor 100 is substantially different from the target charge value. Furthermore, in the same example of the method for programming a floating-gate transistor 300, the gate voltage can be held constant by the Gate DAC 525 when the present charge value of the transistor 100 is substantially similar to the target charge value, enabling precise and accurate programming.

Figure 9:
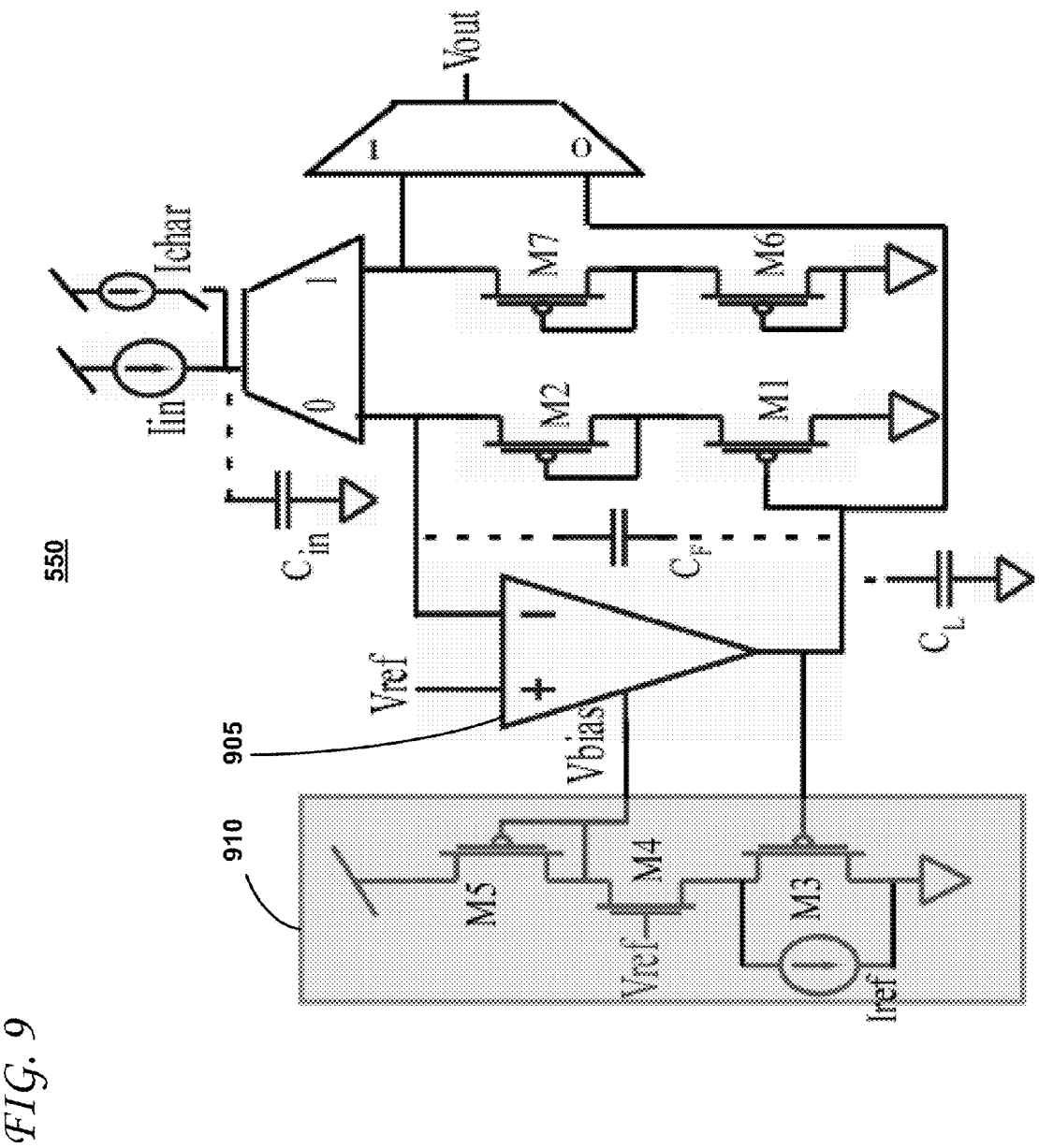
FIG. 9 provides a schematic of the logarithmic transimpedance amplifier 550 of the floating-gate transistor programming system 500 in accordance with an exemplary embodiment of the present invention.

FIG. 9 provides a schematic of the logarithmic transimpedance amplifier 550 of the floating-gate transistor programming system 500 in accordance with an exemplary embodiment of the present invention. At a high level, the logarithmic transimpedance amplifier 550 receives an input current ("$I_{in}$") and provides an output voltage ("$V_{out}$"). More specifically, the logarithmic transimpedance amplifier 550 can be configured in an exemplary embodiment to generate an output voltage that is proportional to the log of the input current. As shown in FIG. 9, the logarithmic transimpedance amplifier 550 can be configured in an exemplary embodiment to provide a feedback path across an amplifier 905. The exemplary embodiment shown in FIG. 9 provides P-type Metal Oxide Semiconductor ("PMOS") transistors M1 and M2 in feedback across amplifier 905. In one embodiment the amplifier 905 can be a five transistor Operational Transconductance Amplifier ("OTA"). In an exemplary embodiment, the amplifier 905 can be configured to hold the input node constant, forcing the current to flow through feedback transistors M1 and M2 and reducing the current through the capacitance at the input node ($C_{in}$). The exponential current to voltage relation of a MOS in subthreshold can enable the logarithmic relation of the logarithmic transimpedance amplifier 550. The exemplary embodiment of the logarithmic transimpedance amplifier 550 further provides an adaptation block 910 configured to modify the bias current of the amplifier 905 and thus can help maintain the stability of the logarithmic transimpedance amplifier 550 over a wide range of current inputs. Specifically, M3 and M4 of the adaptation block 910 can replicate the input current, while M5 mirrors the current into the amplifier 905 bias with a gain. Thus, the adaptation block 910 of the exemplary embodiment of the logarithmic transimpedance amplifier 550 can result in less power consumption when the input current is low. Transistors M7 and M6 of the exemplary embodiment of the logarithmic transimpedance amplifier 550 can provide an open loop current to voltage converter for use with relatively high currents that might normally result in instability. In an exemplary embodiment the fixed feedback resistance of the logarithmic transimpedance amplifier 550 has a very small value in order to measure a wide dynamic range of current spanning several orders of magnitude. To increase the sensitivity of the conversion, M2 can be used in an exemplary embodiment as a source degeneration for M1. Therefore, the inverse of the subthreshold slope, κ, is replaced by an effective κ ("$\kappa_{\mathit{eff}}$") of the combination, which is lesser than $\kappa^2/(\kappa+1)$. Furthermore, the current to voltage relation can be defined as:

$$V_{out} = \frac{V_{ref}}{\kappa^2} + \frac{U_T}{\kappa_{\mathit{eff}}} \ln\left(\frac{I_{in}}{I_P}\right)$$

where $U_T$ is the thermal voltage and $I_p$ is the pre-exponential factor in the current to voltage relation of a sub-threshold PMOS. Small signal analysis of an exemplary embodiment yields the dominant poles, where $C_{IN} \gg C_F$, to be:

$$p_1 \approx -\frac{AG_{ma}}{C_{IN}}; \quad p_2 \approx -\frac{G_{ob}}{C_F + C_L}$$

where A is the gain of the amplifier 905, $G_{ma}$ is the transconductance of the feedback transistors, and $G_{ob}$ is the output conductance of the amplifier 905 in an exemplary embodiment.

In an exemplary embodiment of the floating-gate transistor programming system 500, the logarithmic transimpedance amplifier 550 can be relatively temperature independent. This provides a number of significant advantages over prior art floating-gate transistor measuring circuits, which can be compromised by certain levels of temperature variation. In an exemplary embodiment, the logarithmic transimpedance amplifier 550 can be relatively temperature insensitive because the output voltage ("$V_{out}$") of the logarithmic transimpedance amplifier 550 represents the floating-gate transistor voltage. In one embodiment, the temperature behavior of the logarithmic transimpedance amplifier 550 is opposite to that of the floating-gate transistor and can cancel the change in floating-gate transistor currents. Those of skill in the art will appreciate that minor temperature variations can be present in some implementations of the floating-gate transistor programming system 500 due to a mismatch in sizes of the actual floating-gate transistor and the feedback transistor in the logarithmic transimpedance amplifier 550. In alternative embodiments, a floating-gate current reference can be provided and used to bias the array 200 of floating-gate transistors for temperature insensitive currents. In this embodiment, the floating-gate current reference itself can be programmed based on floating-gate transistor voltage measurements.

Figure 10:
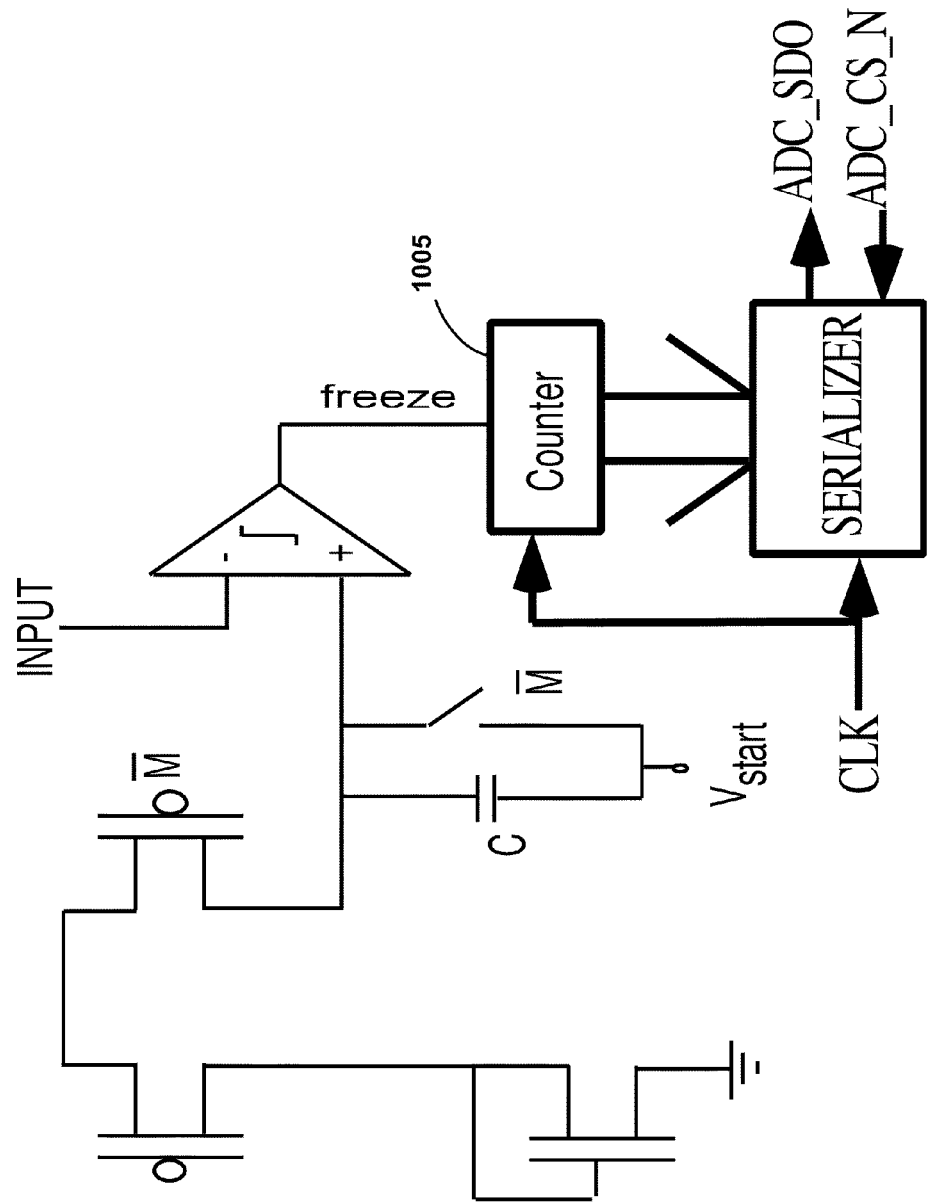
FIG. 10 provides a schematic of the ADC 560 of the floating-gate transistor programming system 500 in accordance with an exemplary embodiment of the present invention.

FIG. 10 provides a schematic of the ADC 560 of the floating-gate transistor programming system 500 in accordance with an exemplary embodiment of the present invention. In an exemplary embodiment of the floating-gate transistor programming system 500, the ADC 560 is a component of the measuring circuit 520 and can provide the interface between the floating-gate transistor programming system 500 and controller 425. In an exemplary embodiment, the output of the counter 1005 can be passed to the controller 425 via an interface, such as an SPI interface. The combination of the logarithmic transimpedance amplifier 550 along with the ADC 560 in an exemplary embodiment provides a measuring circuit 520 that can provide a digital representation of the drain current of a floating-gate transistor 100, and, thus, a value of the charge on a floating-gate of that floating-gate transistor 100. This charge can be used by an exemplary embodiment of the floating-gate transistor programming system 500 to feedback the next drain voltage to be used in programming that floating-gate transistor 100.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. A floating-gate transistor programming system comprising:
    an array of a plurality of floating-gate transistors;
    a measuring circuit comprising a logarithmic transimpedance amplifier and an analog-to-digital converter;
    an injecting circuit comprising a digital-to-analog converter; and
    wherein the pulsing circuit injects charge into each of the plurality of floating-gate transistors and the measuring circuit measures a present charge value in one of the plurality of floating-gate transistors.

2. The floating-gate transistor programming system of claim 1, wherein the array of the plurality of floating-gate transistors is programmed by iteratively injecting charge with injecting circuit and measuring charge with the measuring circuit.

3. The floating-gate transistor programming system of claim 2, wherein the present charge value output from the measuring circuit is used to feedback the next iteration of injecting charge by the injecting circuit.

4. The floating-gate transistor programming system of claim 3, further comprising an interface to a controller enabled to maintain a look-up-table, the look-up-table configured to receive the present charge value as an input and provide an injection pulse period and a drain voltage as a plurality of outputs.

5. The floating-gate transistor programming system of claim 4, wherein injection by the injecting circuit is implemented according to the injection pulse period and the drain voltage.

6. The floating-gate transistor programming system of claim 1, further comprising a tunneling circuit enabled to send a tunneling pulse to erase charge stored in the array of the plurality of floating-gate transistors.

7. The floating-gate transistor programming system of claim 1, further comprising a selection device configured to connect one or more of the plurality of floating-gate transistors to either the measuring circuit or the injecting circuit.

8. The floating-gate transistor programming system of claim 1, further comprising a digital-to-analog converter enabled to be connected to the gate of each of the plurality of floating-gate transistors.

9. The floating-gate transistor programming system of claim 1, wherein the measuring circuit including the logarithmic transimpedance amplifier is relatively temperature independent.

10. A Field Programmable Analog Array ("FPAA") system comprising:
   an array of a plurality of floating-gate transistors;
   a measuring circuit comprising a logarithmic transimpedance amplifier and an analog-to-digital converter;
   an injecting circuit comprising a digital-to-analog converter; and
   wherein the pulsing circuit injects charge into each of the plurality of floating-gate transistors and the measuring circuit measures a present charge value in one of the plurality of floating-gate transistors.

11. The FPAA system of claim 10, wherein the array of the plurality of floating-gate transistors is programmed by iteratively injecting charge with injecting circuit and measuring charge with the measuring circuit.

12. The FPAA system of claim 11, wherein the present charge value output from the measuring circuit is used to feedback the next iteration of injecting charge by the injecting circuit.

13. The FPAA system of claim 11, further comprising an interface to a controller enabled to maintain a look-up-table, the look-up-table configured to receive the present charge value as an input and provide an injection pulse period and a drain voltage as a plurality of outputs.

14. The FPAA system of claim 13, wherein injection by the injecting circuit is implemented according to the injection pulse period and the drain voltage.

* * * * *